(12) United States Patent
Kawazu et al.

(10) Patent No.: US 6,452,475 B1
(45) Date of Patent: Sep. 17, 2002

(54) PROTECTIVE DEVICE

(75) Inventors: Masami Kawazu, Kanuma (JP); Norikazu Iwasaki, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/542,882

(22) Filed: Apr. 4, 2000

(30) Foreign Application Priority Data

Apr. 16, 1999 (JP) .......................................... 11-110163

(51) Int. Cl.⁷ ....................... H01H 85/06; H01H 85/055
(52) U.S. Cl. ....................... 337/290; 337/296; 337/159; 337/416; 29/623
(58) Field of Search ..................... 337/152, 153, 337/159, 160, 182–185, 296, 290, 297, 416; 29/623

(56) References Cited

U.S. PATENT DOCUMENTS

| | | | | |
|---|---|---|---|---|
| 3,445,798 A | * | 5/1969 | Lohrmann | 337/227 |
| 4,873,506 A | * | 10/1989 | Gurevich | 337/290 |
| 5,367,280 A | * | 11/1994 | Thiel et al. | 337/297 |
| 5,712,610 A | * | 1/1998 | Takeichi et al. | 337/290 |
| 5,939,969 A | * | 8/1999 | Doerrwaechter | 337/297 |

FOREIGN PATENT DOCUMENTS

| | | |
|---|---|---|
| JP | A-8-161990 | 6/1996 |
| JP | A-10-116549 | 5/1998 |
| JP | A-10-116550 | 5/1998 |
| JP | B2-2790433 | 6/1998 |

* cited by examiner

*Primary Examiner*—Anatoly Vortman
(74) *Attorney, Agent, or Firm*—Oliff & Berridge, PLC

(57) ABSTRACT

A protective device comprises a fuse element provided to electrodes on a substrate. The fuse element has a liquidus point higher than the mounting temperature of the protective device, and has a solidus point lower than the mounting temperature of the protective device. The difference between the liquidus and solidus points is 5° C. or higher.

6 Claims, 5 Drawing Sheets

( x − x cross section )

(x - x cross section)

(x - x cross section)

(x – x cross section)

(x – x cross section)

( x — x cross section )

PROTECTIVE DEVICE

BACKGROUND OF THE INVENTION

1. Field of the Invention

The present invention relates to a protective device provided with a fuse element on a substrate.

2. Description of the Related Art

Protective devices obtained by forming fuse elements on a substrate are known as chip-type electric fuses. In addition, protective devices in which heating elements are placed in the vicinity of fuse elements are used in overvoltage prevention devices (Japanese Patent No. 2790433, Japanese Patent Application Laid-Open No. 8-161990).

FIGS. 2B and 2C are a plane view and a cross section, respectively, of such a protective device 1o. In the protective device 1o, electrodes 3a, 3b, and 3c are formed on a substrate 2, and solder foil spanning the electrodes 3a, 3b, and 3c is provided as a fuse element 4. The bottom surface of the electrode 3b is provided with a heating element 7 with an insulating layer 8 sandwiched therebetween. Heating current is supplied to the heating element 7 from an electrode 3o through conductors 3x and 3y.

During the fabrication of the protective device 1o, the conductors 3x and 3y, heating element 7, insulating layer 8, and electrodes 3a, 3b, and 3c are formed on the substrate 2; solder paste 5 is then applied to the electrodes 3a, 3b, and 3c in the manner shown in FIG. 2A; a fuse element 4 is mounted on top; and a cover (not shown) is provided as needed. The protective device 1o thus obtained is commonly heated and mounted on a base circuit board by reflowing, soldering, or a similar technique.

To prevent the fuse element 4 from melting during the mounting of the protective device 1o, materials whose solidus point is higher than the mounting temperature of the fuse element 4 (in particular, whose solidus point is higher than the maximum temperature achieved during mounting, and whose liquidus point is even higher) are used for the fuse element 4. In addition, materials whose liquidus points are at or above the temperature maintained during heating and mounting are selected for the solder paste 5. When, for example, the temperature at which the protective device 1o is mounted on a circuit board is set to 250° C., a material whose liquidus point is 250° C. or higher is used for the solder paste 5 of the protective device 1o, and a material whose solidus point is higher than the liquidus point of the solder paste 5 is used for the fuse element 4.

When the above-described protective device 1o is used as a protective device in an apparatus to be protected, a malfunction in the apparatus causes an overcurrent to flow through the fuse element 4 and to melt it, or causes the heating current from the electrode 3o to be supplied to the heating element 7 through the conductors 3x and 3y, and the fuse element 4 to be melted by the generated heat. A drawback, however, is that the high liquidus point of the fuse element 4 increases the time between the beginning of the increase in the temperature of the fuse element 4 and the melting of the element, resulting in a protective device with an extended operating response. Increasing the time that elapses before the fuse element 4 is melted is disadvantageous in that the area where the protective device 1o is mounted on the base circuit board melts before the fuse element 4 does, causing the protective device 1o to separate from the base circuit board and inducing undesirable changes in peripheral mounted components, substrate wiring, and the like.

Another drawback is that the existence of the above-described relation between the liquidus points and solidus points of the fuse element 4 and solder paste 5 on the protective device 1o reduces the number of available materials and increases costs. In particular, attempts to bring the solidus point of the fuse element 4 closer to (or slightly above) the mounting temperature of the protective device 1o in order to improve the operating response are hampered by the scarcity of suitable fuse element materials having such solidus points.

SUMMARY OF THE INVENTION

An object of the present invention, which is aimed at overcoming the above-described drawbacks of prior art, is to improve the operating response, to widen the selection of materials for fuse elements, and to reduce manufacturing costs in a protective device obtained by forming a fuse element on a substrate.

The inventors perfected the present invention upon discovering that raising the liquidus point of the fuse element material in order to prevent the fuse element from melting during the mounting of a protective device obtained by forming the fuse element on a substrate dispenses with the need to increase the solidus point above the mounting temperature as long as the liquidus point is higher than the mounting temperature of the protective device; that is, keeping the solidus point below the mounting temperature, and the liquidus point above the mounting temperature allows the fuse element to perform its function because the fuse element is prevented from melting during mounting while being allowed to change its initial shape to a certain extent.

Specifically, the present invention provides a protective device in which a fuse element is provided to electrodes on a substrate, wherein the fuse element has a liquidus point higher than the mounting temperature of the protective device, and has a solidus point lower than the mounting temperature of the protective device.

These and other objects, features and advantages of the present invention are described in or will become apparent from the following detailed description of the invention.

DETAILED DESCRIPTION OF THE INVENTION

Figure 1A:
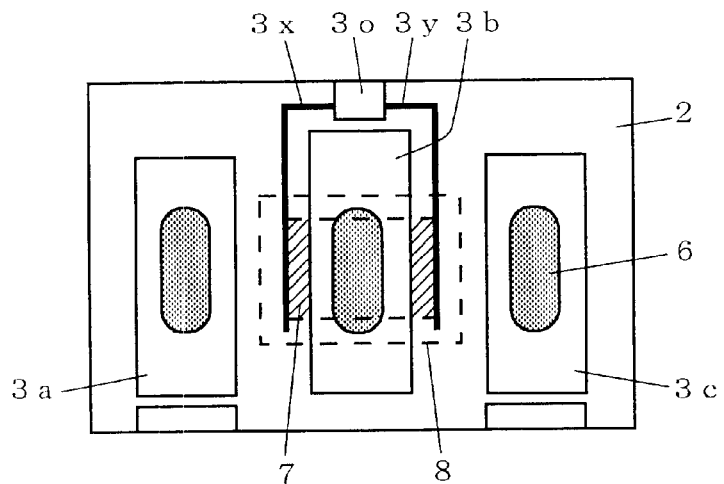
FIGS. 1A to 1C are diagrams illustrating the steps for manufacturing the protective device of the present invention.

The protective device of the present invention will now be described in detail with reference to the drawings. In the drawings, the same symbols denote identical or equivalent constituent elements.

The protective device of the present invention is obtained by providing a fuse element to electrodes on a substrate. The substrate, electrodes, and fuse element are not subject to any particular limitations in terms of shape or arrangement. Consequently, the protective device of the present invention may be constituted as a chip-type current fuse obtained by providing a fuse element to electrodes on a substrate, or as a protective device obtained by further providing a heating element in the vicinity of the fuse element and using the product as an overvoltage prevention device. It is possible, for example, to use the same arrangement as that adopted for the protective device 1o described with reference to FIGS. 2A to 2C above.

Figure 1B:
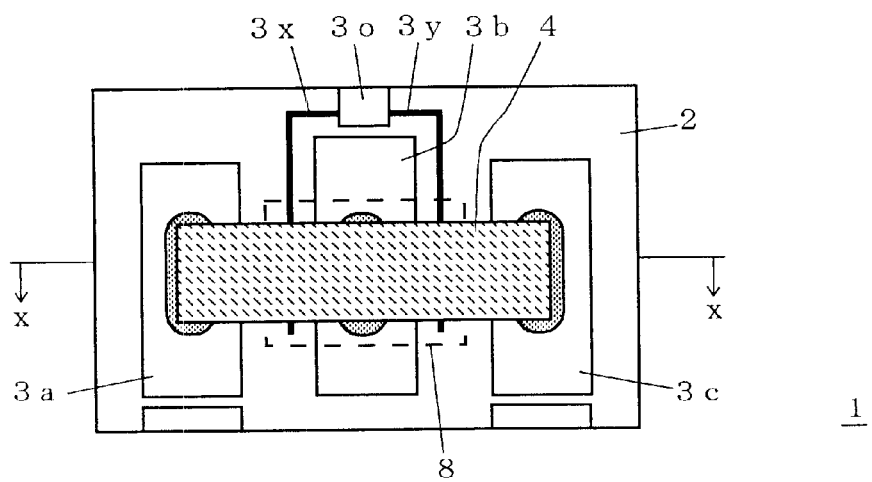
Figure 1C:
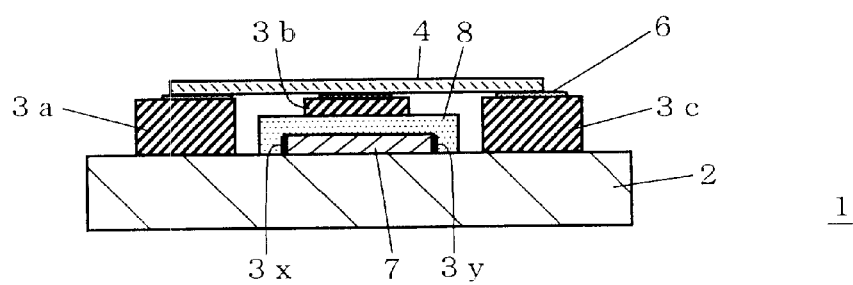

No particular restrictions are imposed on the materials constituting the substrate or electrodes, and the same materials as those used for a conventional protective device may be adopted. With the present fuse element, however, the liquidus point should be higher than the predetermined mounting temperature of the protective device, preferably higher than the maximum temperature achieved during mounting. In addition, the solidus point of the material should be lower than the mounting temperature, preferably lower than the maximum temperature achieved during mounting. This gives a much wider selection of fuse element materials. In addition, the fuse element starts melting during mounting, and is thus easier to mount on the electrodes when a solder paste is not interposed between the electrodes and the fuse element. For example, the fuse element 4 and the electrodes 3a, 3b, and 3c can be securely bonded and a protective device 1 obtained (as shown in FIGS. 1B and 1C) merely by coating the electrodes 3a, 3b, and 3c with rosin or another flux 6 instead of a solder paste (as shown in FIG. 1A). The manufacturing costs of the protective device 1 can thus be reduced. In addition, using solder paste to mount a solder foil of prescribed composition as the fuse element 4 causes this solder foil to melt during reflowing or the like, whereas dispensing with the solder paste overcomes this problem as well.

The difference between the liquidus and solidus points of the fuse element 4 should be 5° C. or higher, and preferably 10° C. or higher. When the difference between the liquidus and solidus points is less than 5° C., it becomes impossible to cope with the commonly encountered nonuniformity of the mounting temperature, and the fuse element occasionally melts. Reducing this nonuniformity prevents the fuse element from melting as a result of the narrow difference between the liquidus and solidus points, but eliminating this nonuniformity is unsuitable because it requires maintaining very stringent conditions for the manufacture of the fuse element 4. Nor is it suitable for the liquidus point of the fuse element 4 to be more than 50° C. above the maximum temperature achieved during mounting, because the operating response of the protective device 1 is adversely affected in this case.

The material constituting the fuse element 4 having such a liquidus point and a solidus point can be appropriately selected from conventional fuse element materials. For example, it is possible to use Sn-Pb solder foil, common solder, or the like. In this case, the component ratio of the material should be adjusted in order to provide the fuse element 4 with prescribed solidus point and liquidus point. In the particular case of a Sn-Pb solder foil, the liquidus point can be continuously adjusted by varying the Sn and Pb ratio in an appropriate manner.

With the present invention, in addition to a fuse element being provided to the electrode on a substrate, a heating element is further provided in the vicinity of the fuse element in order to allow the protective device of the present invention to be used for an overvoltage prevention device as well. Such embodiment in which a fuse element and a heating element are provided in the vicinity of each other includes an embodiment in which a fuse element (low-melting metal element) is stacked on a heating element with an insulating layer sandwiched therebetween as described with reference to FIGS. 1A to 1C and FIGS. 2A to 2C, as well as in Japanese Patent No. 2790433 and Japanese Patent Application Laid-open No. 8-161990, an embodiment in which a fuse element is stacked on a heating element without an interposed insulating layer as described in Japanese Patent Application No. 11-94385, and an embodiment in which a heating element and a fuse element are arranged in a planar configuration on a substrate as described in Japanese Patent Application Laid-open Nos. 10-116549 and 10-116550.

Figure 3A:
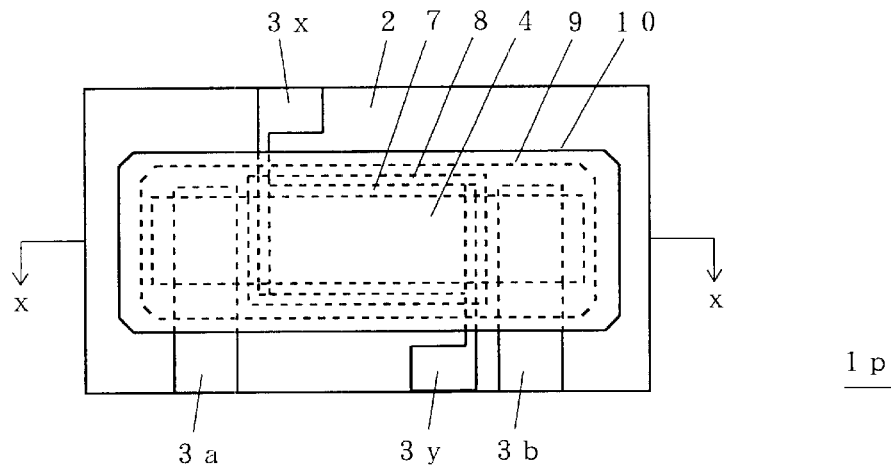
FIGS. 3A and 3B are a plane view and a cross section of a protective device, respectively.
Figure 3B:
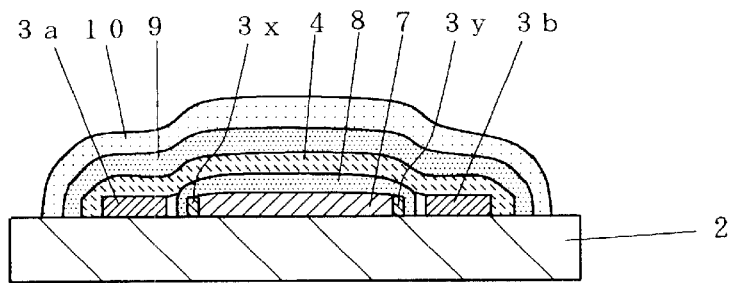

For example, the protective device 1p shown in FIGS. 3A and 3B may be constituted such that a heating element 7 formed by applying or otherwise using a resistive paste, an insulating layer 8, and a fuse element 4 consisting of a fuse material are sequentially stacked on a substrate 2. In the drawing, 3x and 3y are heating element electrodes, and 3a and 3b are fuse element electrodes. In addition, 9 is an internal seal composed of solid flux or the like and designed to cover the fuse element 4 in order to prevent the surface of the fuse element 4 from oxidation, and 10 is an external seal composed of a material whose melting point or softening point is higher than that of the fuse element 4, and designed to prevent molten material from flowing out of the fuse element 4 during the melting of the element.

Figure 4:
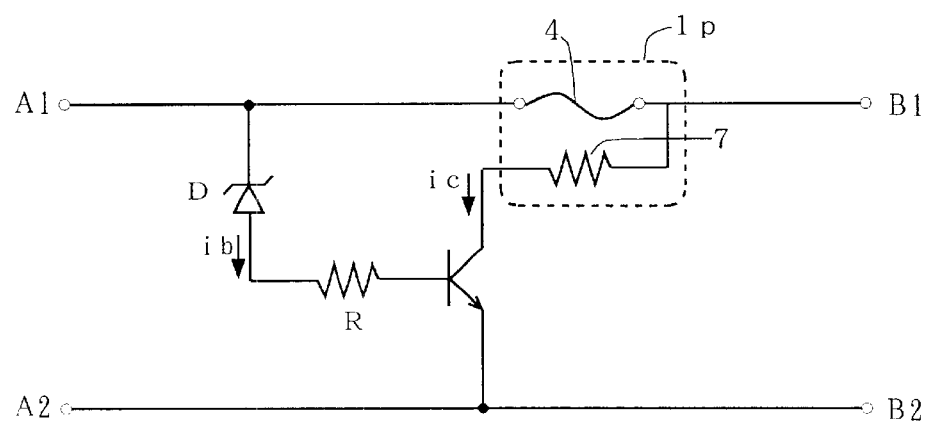
FIG. 4 is a circuit diagram of an overvoltage prevention device.

FIG. 4 is a circuit diagram of an overvoltage prevention device obtained using such a protective device 1p. In this circuit, the electrode terminals of a lithium ion battery or other protected device are connected to terminals A1 and A2, and the electrode terminals of a charger or other device connected to the protected device are connected to terminals B1 and B2. With this overvoltage prevention device, base current ib flows abruptly, powerful collector current ic flows through the heating element 7 as a result, and the heating element 7 heats up when a lithium ion battery is charged and a reverse voltage exceeding the breakdown voltage is applied to a Zener diode D. Evolved heat is transmitted to the fuse element 4 on the heating element 7, and the fuse element 4 melts, preventing overvoltage from being applied to the terminals A1 and A2.

the substrate 2, and the solder foil used had the following measurements: 0.15 mm (thickness)×1.0 mm (width)×4.2 mm (length).

TABLE 1

|  | Solder paste | | | Solder foil | | |
| --- | --- | --- | --- | --- | --- | --- |
|  | Composition | Solidus point | Liquidus point | Composition | Solidus point | Liquidus point |
| Example 1 | Sn:Pd = 60:40 | 183° C. | 183° C. | Sn:Pd = 33:67 | 183° C. | 252° C. |
| Example 2 | Sn:Pd = 60:40 | 183° C. | 183° C. | Sn:Pd = 25:75 | 183° C. | 268° C. |
| Example 3 | Sn:Pd = 40:60 | 183° C. | 248° C. | Sn:Pd = 33:67 | 183° C. | 252° C. |
| Example 4 | Sn:Pd = 40:60 | 183° C. | 248° C. | Sn:Pd = 25:75 | 183° C. | 268° C. |
| Example 5 | Sn:Pd = 90:10 | 247° C. | 259° C. | Sn:Pd = 25:75 | 183° C. | 268° C. |
| Example 6 | No use | | | Sn:Pd = 25:75 | 183° C. | 268° C. |
| Comparative example 1 | Sn:Pd = 90:10 | 247° C. | 259° C. | Sn:Pd = 5:95 | 300° C. | 314° C. |
| Comparative example 2 | Sn:Pd = 91:9 | 246° C. | 246° C. | Sn:Pd = 13:87 | 253° C. | 253° C. |

Figure 5A:
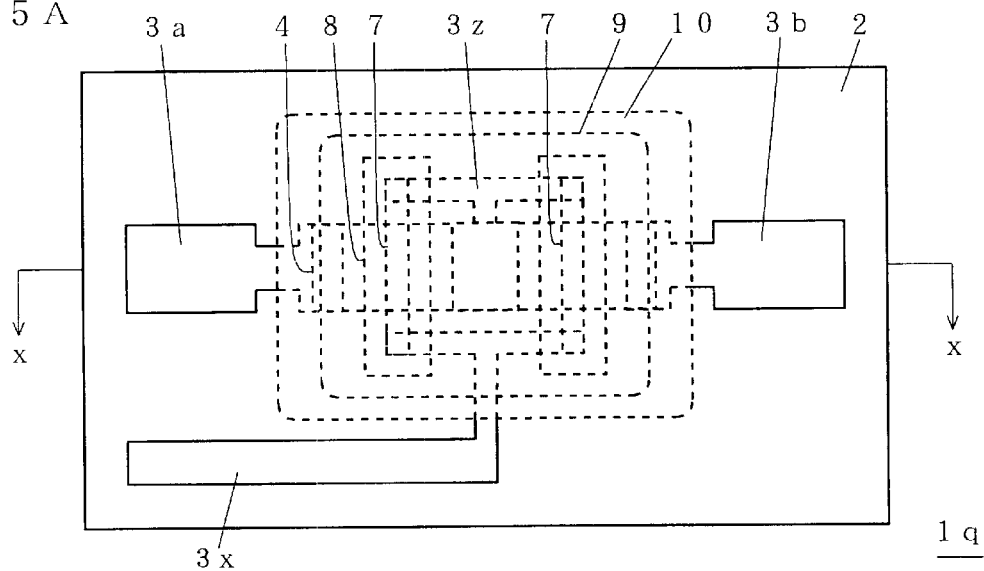
FIGS. 5A and 5B are a plane view and a cross section of a protective device, respectively.
Figure 5B:
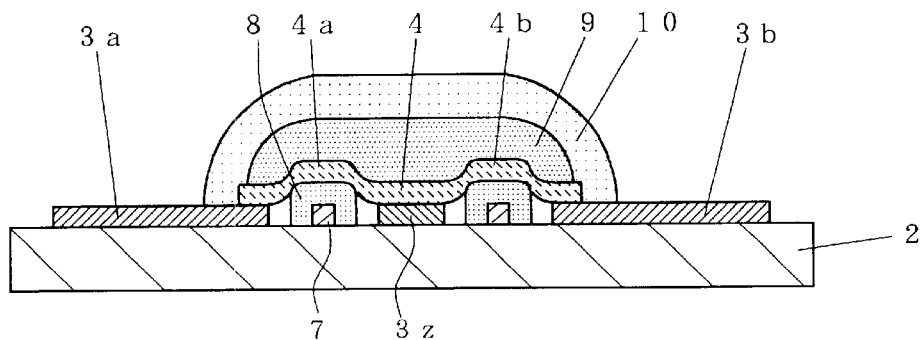

FIGS. 5A and 5B are a plane view and a cross section of a protective device 1q constituted differently from the protective device 1p in FIGS. 3A and 3B above. In the protective device 1q, two heating elements 7 are connected by means of a middle electrode 3z, and a fuse element 4 is provided thereon with an insulating layer 8 sandwiched therebetween.

Figure 6:
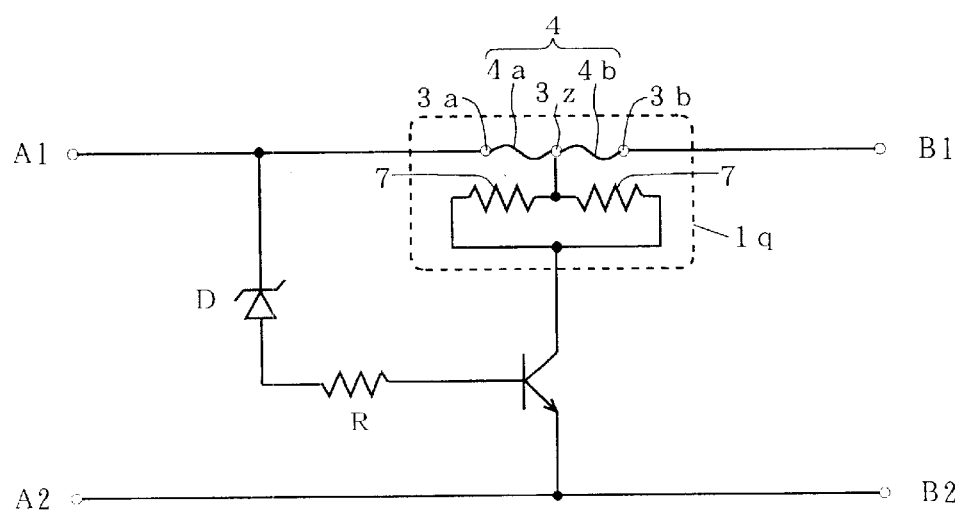
FIG. 6 is a circuit diagram of an overvoltage prevention device.

FIG. 6 is a circuit diagram of an overvoltage prevention device obtained using such a protective device 1q. Whereas the overvoltage prevention device whose circuit is shown in FIG. 4 above is constituted such that the heating element 7 continues to be energized even after the fuse element 4 has been melted by overvoltage, the overvoltage prevention device whose circuit is shown in FIG. 6 is constituted such that the heat evolved by the heating element 7 melts the fuse element 4 at two locations (4a and 4b), completely preventing the current from flowing through the heating element 7 following such melting.

Figure 7A:
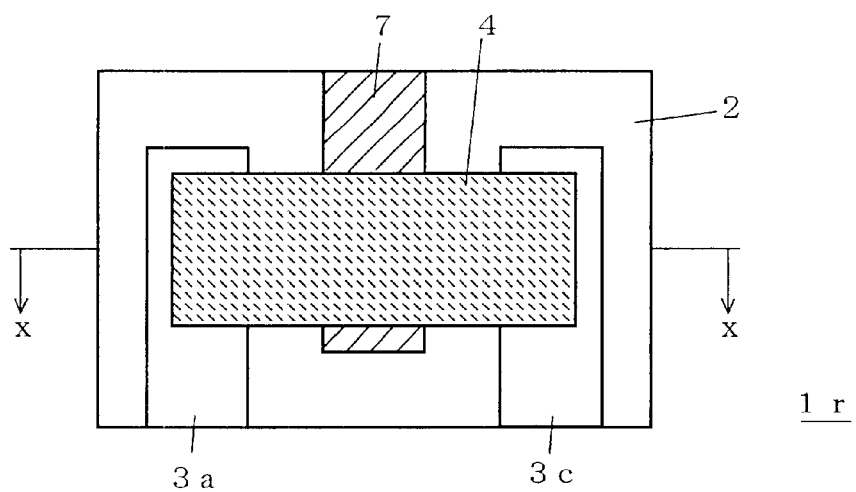
FIGS. 7A and 7B are a plane view and a cross section of a protective device, respectively.
Figure 7B:
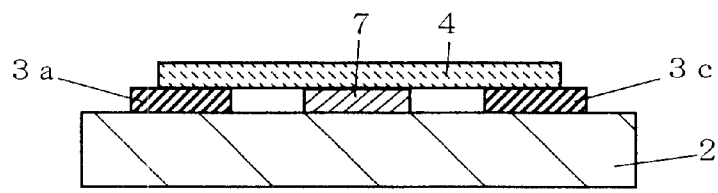

The protective device 1r in FIGS. 7A and 7B is a protective device in which the overvoltage prevention device whose circuit is shown in FIG. 6 can be used. Unlike the protective device 1q in FIGS. 5A and 5B, the protective device 1r is designed to provide a sufficiently wide surface area for the heating element 7 or the electrodes 3a and 3b wetted by the molten fuse element 4 during the melting of this element, facilitating melting and making it possible to dispense with the formation of an insulating layer 8 on the heating element 7. Without the insulating layer 8, the heating element 7 has an even shorter operating time.

EXAMPLES

The present invention will now be described in detail through examples.

Examples 1–6 and Comparative Examples 1–2

Figure 2A:
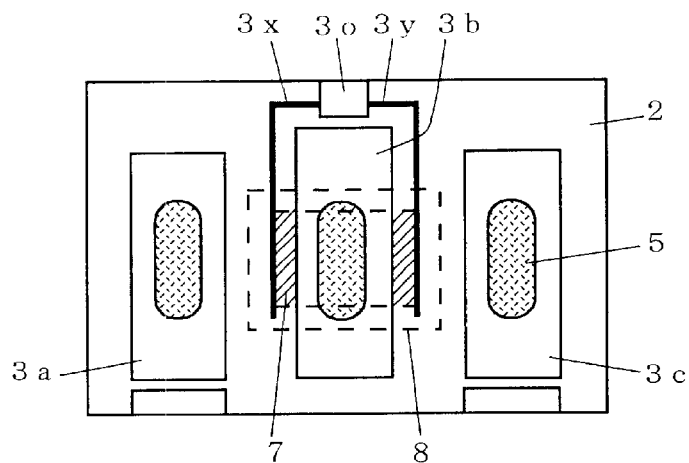
FIGS. 2A to 2C are diagrams illustrating the steps for manufacturing a protective device.
Figure 2B:
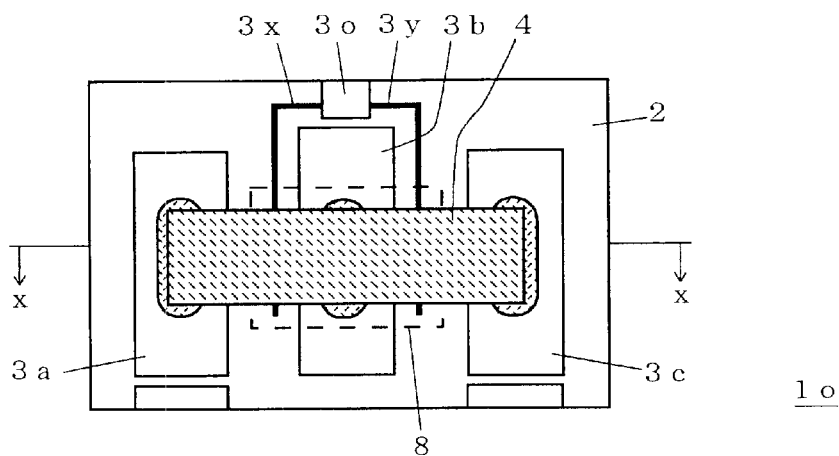
Figure 2C:
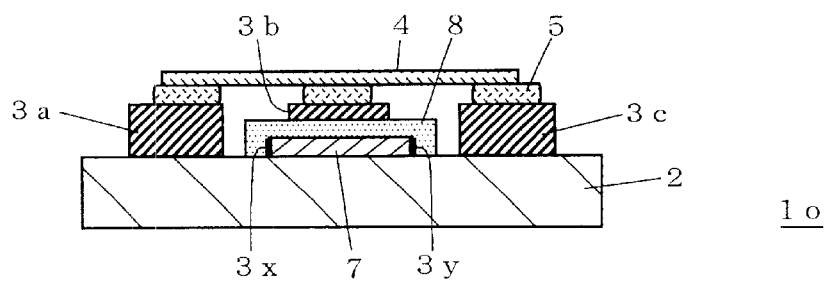

The solder paste and solder foil shown in Table 1 were used to fabricate a protective device obtained without the use of a solder paste (FIGS. 1A to 1C) and a protective device obtained using a solder paste (FIGS. 2A to 2C). In the process, an aluminum substrate (3 mm×5 mm) was used as Evaluation The protective devices obtained in the working and comparative examples were measured for their (a) oven heat resistance, (b) heater resistance, (c) fuse resistance, (d) 4 W operating time, and (e) 10 A melting time in the manner described below. The results are shown in Tables 2 to 4.

(a) Oven Heat Resistance

Each protective device was first coated with flux in order to prevent oxidation of the solder foil and to create conditions conducive to solder foil melting. The protective devices were not capped. The protective devices were then placed in an oven (STH-120, manufactured by ESPEC) set to a prescribed temperature, allowed to stand for 1 minute after the temporarily reduced interior temperature of the oven had returned to the preset temperature, taken out of the oven, and inspected to establish whether the solder foil had melted. The set temperature of the oven was varied by +5° C. or −5° C., and the same operations were repeated. The temperature at which the solder foil did not melt at all during such repeated operations served as a heat resistance index.

(b) Heater Resistance

The resistance value of the heater unit was measured using a multimeter (ADVANTEST TR 6847).

(c) Fuse Resistance

The resistance value of the solder foil was measured using a multimeter (ADVANTEST TR 6847).

(d) 4 W Operating Time

4 W (electric power) was supplied to the heater unit, heat was evolved, and the solder foil was melted by this heat. The time elapsed between the application of 4 W and the melting of the solder foil was measured.

(e) 10 A Melting Time

The current, 10 A(ampere) was passed through the solder foil, inducing self-heating in the foil to melt the solder foil. The time elapsed between the passage of 10 A and the melting of the solder foil was measured.

TABLE 2

| | Oven Heat Resistance (° C.) |
|---|---|
| Example 1 | 210 |
| Example 2 | 215 |
| Example 3 | 245 |
| Example 4 | 245 |
| Example 5 | 250 |
| Example 6 | 250 |
| Comparative example 1 | 250 |
| Comparative example 2 | 240(*) |

Note:
(*)The solder foil melted during element fabrication

TABLE 3

| | Heater Resistance (Ω) | | | | Fuse Resistance (mΩ) | | | |
|---|---|---|---|---|---|---|---|---|
| | (max.) | (min.) | (average) | (standard dev.) | (max.) | (min.) | (average) | (standard dev.) |
| Example 1 | 4.2 | 3.8 | 4.05 | 0.41 | 11.2 | 9.9 | 10.46 | 0.41 |
| Example 2 | 4.1 | 3.8 | 3.98 | 0.08 | 10.8 | 8.8 | 9.29 | 0.50 |
| Example 3 | 4.1 | 3.9 | 3.99 | 0.06 | 11.4 | 10.0 | 10.6 | 0.46 |
| Example 4 | 4.1 | 3.9 | 3.93 | 0.08 | 11.2 | 9.1 | 10.24 | 0.64 |
| Example 5 | 4.2 | 3.9 | 4.08 | 0.08 | 10.9 | 10.4 | 10.6 | 0.08 |
| Example 6 | 4.0 | 3.9 | 3.96 | 0.05 | 14.4 | 11.0 | 12.79 | 1.11 |
| Comparative example 1 | 4.2 | 4.0 | 4.11 | 0.06 | 16.3 | 14.8 | 15.7 | 0.48 |
| Comparative example 2 | — | — | — | — | — | — | — | — |

TABLE 4

| | 4 W Operating Time (sec) | | | | 10 A Melting Time (sec) | | | |
|---|---|---|---|---|---|---|---|---|
| | (max.) | (min.) | (average) | (standard dev.) | (max.) | (min.) | (average) | (standard dev.) |
| Example 1 | 9.8 | 7.2 | 9.1 | 0.76 | 20 | 16 | 18 | 1.06 |
| Example 2 | 10.4 | 7.3 | 9.6 | 0.76 | 21 | 16 | 19 | 1.5 |
| Example 3 | 10.2 | 8.0 | 9.7 | 0.76 | 23 | 17 | 20 | 2.05 |
| Example 4 | 10.5 | 8.0 | 9.75 | 0.79 | 29 | 17 | 23 | 3.55 |
| Example 5 | 10.6 | 8.4 | 9.9 | 0.60 | 24 | 20 | 22 | 1.08 |
| Example 6 | 8.1 | 6.6 | 7.5 | 0.60 | 17 | 11 | 13.8 | 2.68 |
| Comparative example 1 | 12.9 | 11.0 | 11.99 | 0.68 | 25 | 21 | 23.1 | 1.55 |
| Comparative example 2 | — | — | — | — | — | — | — | — |

In Examples 1 to 6, both the heat resistance and operating response were adequate.

In particular, it can be seen in Table 2 that a higher liquidus point yields better oven heat resistance both for a solder paste and for a solder foil.

According to the evaluation of the 4 W operating time, the operating time is shorter for a protective device obtained without the use of a solder paste (Example 6) than for a protective device obtained using a solder paste (Examples 1 to 5). This is believed to be due to the fact that the protective device of Example 6 is such that the amount of solder that melts in the process or the amount of solder that wets the electrodes is proportionally smaller due to the absence of a solder paste.

According to the evaluation of the 10 A melting time, the protective device of Example 6 had, on average, melted 10 seconds faster than that of Comparative Example 1.

According to the present invention, the operating response of a protective device obtained by forming a fuse element on a substrate can be improved because the solidus point of the fuse element is set lower than in a conventional example. This also allows the selection of materials for fuse elements to be widened, and the manufacturing costs reduced. Another feature is that when the protective device is used to heat and melt a fuse element with a separate heating element during the malfunctioning of an apparatus to be protected, the effect of heat on peripheral components other than the fuse element of the protective device is reduced, and mounting reliability is improved.

Yet another feature is that the fuse element is kept in a reflowed state because the solidus point of the fuse element is set to a level below the mounting temperature. It is therefore possible to mount the fuse element on the electrodes without an interposed solder paste. Lower manufacturing costs and higher yield are thus obtained by reducing materials consumption, simplifying manufacturing parameters, and the like.

The entire disclosure of the specification, the claims, the drawings and the summary of Japanese Patent Application No. 11-110163 filed on Apr. 16, 1999 is hereby incorporated by reference.

What is claimed is:

1. A protective device, comprising:

a fuse element provided to electrodes on a substrate, wherein the fuse element has a liquidus point higher than a predetermined mounting temperature of said protective device, and has a solidus point lower than the predetermined mounting temperature of said protective device.

2. A protective device according to claim 1, wherein the difference between the liquidus and solidus points of the fuse element is about 5° C. or higher.

3. A protective device according to claim 1, wherein the liquidus point of the fuse element is higher than the maximum temperature achieved during the mounting of said protective device, and the solidus point thereof is lower than the maximum temperature achieved during the mounting of said protective device.

4. A protective device according to claim 1, wherein the fuse element is solder foil.

5. A protective device according to claim 1, wherein the fuse element is placed over the electrodes without an interposed solder paste.

6. A protective device according to claim 1, wherein a heating element is placed in the vicinity of the fuse element.

* * * * *